United States Patent [19]
Chiu

[11] Patent Number: 5,682,174
[45] Date of Patent: Oct. 28, 1997

[54] MEMORY CELL ARRAY FOR DIGITAL SPATIAL LIGHT MODULATOR

[75] Inventor: Edison H. Chiu, Richardson, Tex.

[73] Assignee: Texas Instruments Incorporated, Dallas, Tex.

[21] Appl. No.: 389,674

[22] Filed: Feb. 16, 1995

[51] Int. Cl.$^6$ ............................................. G09G 3/34
[52] U.S. Cl. ................................. 345/84; 345/211
[58] Field of Search .................... 345/84, 85, 86, 345/212, 211, 213, 87, 94, 95, 55, 98; 348/770, 771; 365/154; 349/1, 33, 34

[56] References Cited

U.S. PATENT DOCUMENTS

| | | | |
|---|---|---|---|
| 4,303,918 | 12/1981 | Reagan et al. | 345/70 |
| 4,662,746 | 5/1987 | Hornbeck | 350/269 |
| 4,928,266 | 5/1990 | Abbott et al. | 365/154 |
| 4,956,619 | 9/1990 | Hornbeck | 330/4.3 |
| 5,061,049 | 10/1991 | Hornbeck | 359/224 |
| 5,065,148 | 11/1991 | Yee-Kworg | 345/95 |
| 5,079,544 | 1/1992 | DeMond | 340/701 |
| 5,083,857 | 1/1992 | Hornbeck | 359/291 |
| 5,105,369 | 4/1992 | Nelson | 364/525 |
| 5,142,405 | 8/1992 | Hornbeck | 359/226 |
| 5,278,652 | 1/1994 | Urbanus et al. | 358/160 |
| 5,404,150 | 4/1995 | Murata | 345/211 |
| 5,420,603 | 5/1995 | Tsuboyama et al. | 345/87 |
| 5,471,225 | 11/1995 | Parks | 348/771 |
| 5,499,062 | 3/1996 | Urbanus | 345/84 |
| 5,510,731 | 4/1996 | Ringwall | 326/63 |

*Primary Examiner*—Richard Hjerpe
*Assistant Examiner*—Lun-Yi Lao
*Attorney, Agent, or Firm*—Robert C. Klinger; James C. Kesterson; Richard L. Donaldson

[57] ABSTRACT

A spatial light modulator (SLM) (20) having a pixel array (21) and a memory cell array (21a). Drivers (23c, 24b, 26, 27, 28) for the memory cell inputs permit pixels (10) of the SLM (20) to be addressed at a higher voltage than the voltage used for peripheral control circuitry (22, 23, 24). Each driver (23c, 24b, 26, 27, 28) has appropriate logic for providing an input signal to the memory cell array (21a) and a voltage translator (60) for changing the voltage level of that signal.

15 Claims, 4 Drawing Sheets

MEMORY CELL ARRAY FOR DIGITAL SPATIAL LIGHT MODULATOR

CROSS-REFERENCE TO RELATED APPLICATIONS

Cross-reference is made to the following co-pending patent applications, the teachings of which are incorporated herein by reference.

U.S. patent application Ser. No. 08/373,692 filed Jan. 17, 1995 entitled "Monolithic Programmable Format Pixel Array"

U.S. patent application Ser. No. 08/387,673 entitled "Spatial Light Modulator Having Single Bit-Line Dual-Latch Memory Cells"

TECHNICAL FIELD OF THE INVENTION

This invention relates to spatial light modulators, and more particularly to a spatial light modulator (SLM) having a memory cell array for storing data for addressing the SLM.

BACKGROUND OF THE INVENTION

Spatial light modulators (SLMs), as used for imaging applications, are arrays of pixel-generating elements that emit or reflect light to an image plane. The pixel-generating elements are often themselves referred to as "pixels", as distinguished from the pixels of the image. This terminology is clear from context so long as it is understood that more than one pixel of the SLM array can be used to generate a pixel of the image.

The pixels of the SLM are individually addressable, such that the image is defined by which pixels are on or off at a given time. Moving images can be generated by re-addressing image frames. Greyscale images can be created with various modulation schemes, and color images can be created by filtering the emitted or reflected light.

A digital micro-mirror device (DMD), sometimes referred to as a deformable micro-mirror device, is a type of SLM. It may be used to form images, and has been used in both display and printing applications. A DMD used for imaging applications such as display or printing, has an array of hundreds or thousands of tiny tilting mirrors. Light incident on the DMD is selectively reflected or not reflected from each mirror to an image plane. Each mirror is attached to one or more hinges mounted on support posts, and is spaced by means of an air gap over underlying control circuitry. The control circuitry includes a memory cell associated with each mirror. Each memory cell stores a 1-bit data value, which determines the state of an applied electrostatic force applied to the mirror. This electrostatic force is what causes each mirror to selectively tilt. DMDs may be manufactured using integrated circuit techniques, with the mirror elements fabricated over a substrate that contains the memory cells.

For imaging applications, the DMD memory cell array must be loaded with large volumes of data at fast data rates. For this purpose, DMD devices have special data loading circuitry. This circuitry includes shift registers that receive a row of data, which they pass down column lines of the array via bit-lines. The proper row is selected with a row selector.

With the DMD, the electrostatic force that causes a mirror to tilt is generated by applying a positive potential, typically +5 volts, to one address electrode and 0 volts to the other address electrode. The mirror is provided a potential, typically +32 volts, thereby creating a greater potential between one electrode and the mirror than between the other electrode an the mirror. The mirror tilts toward the electrode providing the greatest voltage potential. The surface area of the address electrode also factors into the electrostatic force generated.

The "address margin" is the voltage swing of the potential provided to the address electrodes, typically 5 volts in the example above. To avoid inadvertently setting a mirror in the wrong position, it is desired to increase the address margin. However, the memory cells are currently operated using the same power supply as that used to operate the row addressing and column data loading circuitry, which operate at TTL or CMOS levels and use a 5 volt supply.

It is desired to increase the address margin of the mirrors without affecting the operation of the present row address and column data load circuitry. In addition, it is desired to increase the address margin without increasing the surface area of the address electrodes, which is limited by the area of the pixel of the DMD.

SUMMARY

A technical advantage of the invention is a spatial light modulator (SLM) with an increased address margin. The address margin is increased by providing driver circuitry between the DMD control circuitry and the memory cell array to provide potentials on the address electrodes being greater than the voltage supply operating the control circuitry. The invention does not require the surface area of the electrodes to be increased. In addition, the potentials of the address electrodes can be pulsed to help achieve a reset of the mirrors without affecting the control circuitry and without losing the contents of the memory cells.

The present invention preferably comprises a spatial light modulator having an array of pixels controlled by an array of memory cells. The memory cell array is arranged in rows and columns. Control circuitry controls the memory cell array, and includes a bit-line associated with each column of memory cells delivering pixel data thereto. The control circuitry also includes a write word-line associated with each row of the memory cells providing a write signal to enable the row of cells to be written with the pixel data. A bit-line driver circuit is provided to increase a voltage level of the pixel data before it is delivered to the memory cells. Similarly, a write word-line driver increases a voltage level of the write signal before it is delivered to the memory cells.

The bit-line driver circuit and the write-line driver circuit operate on a power supply separate from and having a potential greater than the potential of a power supply driving the control circuitry. The TTL or CMOS level bit-line and word-line control signals are increased to about 8 volts, thus achieving an address margin of 8 volts for the DMD pixel mirror. This address voltage can be pulsed to help achieve a reset of the mirrors, such as between 3 and 5 volts, without disturbing the memory cell contents, and with disturbing the normal operation of the control circuitry. Higher electrostatic forces are achieved without increasing the surface area of the address electrodes.

Preferably, the memory cells have a dual-latch (shadow latch), whereby a transfer signal loads the pixel data in the first latch to the second latch, thus freeing the first latch to again be loaded with pixel data. A driver circuit is provided for the transfer signal as well. One memory cell can be provided for each pixel mirror, or for a plurality of mirrors. The present invention achieves a high-performance, low power, and long life device.

DETAILED DESCRIPTION OF THE INVENTION

The following description is in terms of a DMD-type spatial light modulator (SLM), which has a memory cell associated with each mirror element (pixel). The memory cells are loaded with 1-bit data values on a row-by-row basis, via bit-lines that deliver the data down columns of the memory cell array. The data loaded to each memory cell represents an address signal for tilting an associated mirror element. The invention is directed to an improved memory cell array, which uses various driver circuits on memory cell input lines. These driver circuits increase the voltage levels of the control signals, providing a higher address margin when addressing the mirror elements. The power supply voltage for the driver circuits is higher than is used for the DMD peripheral control circuitry.

However, the invention is not limited to use with DMDs, and applies to other types of SLMs that use similar data loading and addressing methods. The SLM is assumed to have individually addressable pixels that either emit or reflect light for generating pixels of an image. The invention would apply to the use of different voltage levels for addressing these pixels than is used for peripheral control circuitry.

Figure 1A:
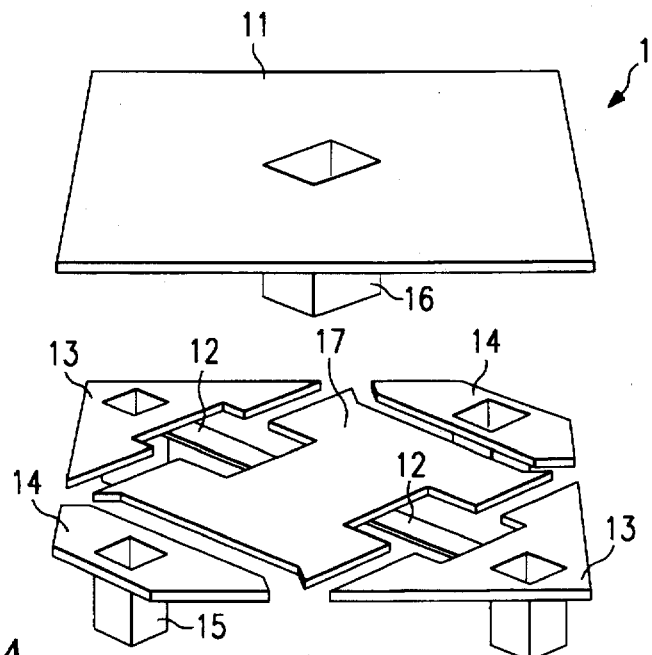
FIG. 1 is an exploded view of a hidden-hinge type mirror element used in a digital micro-mirror device and having a memory cell with data and control inputs in accordance with the invention.
Figure 1A:
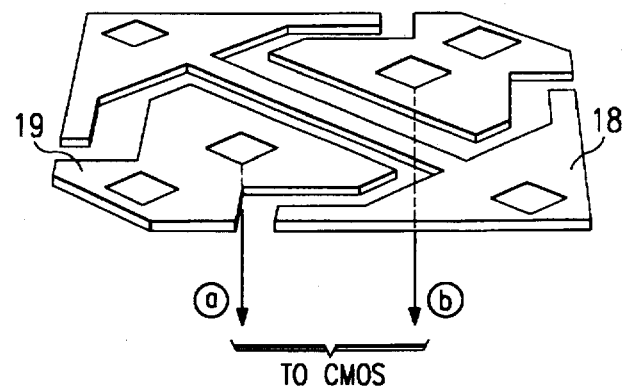
Figure 1B:
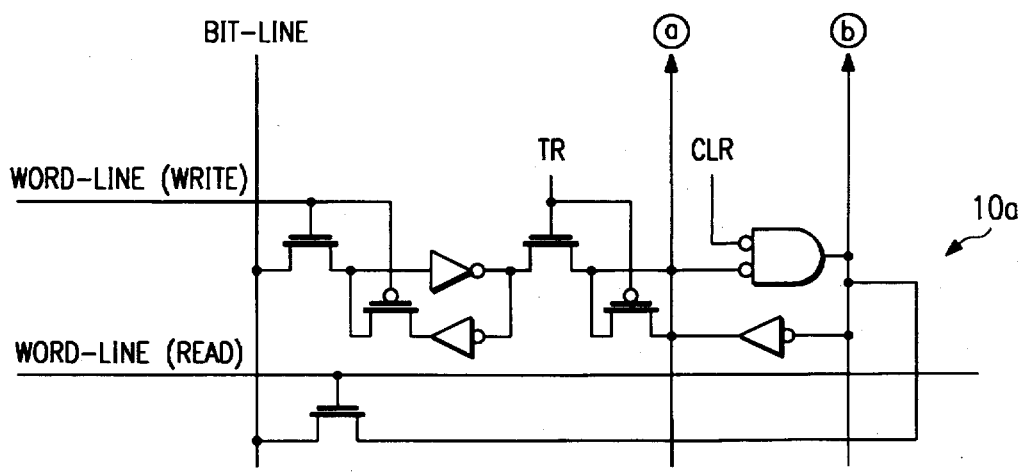

FIG. 1 is an exploded perspective view of a single mirror element 10 of a DMD. For purposes of example, mirror element 10 is a hidden-hinge type mirror element. As with other DMD designs, the hinge 12 is supported on support posts 13. Additionally, address electrodes 14 are supported by electrode posts 15 on the same level as hinge 12 and hinge support posts 13. The mirrors 11 are fabricated above the hinge/electrode layer and are supported by mirror support posts 16.

Mirror support post 16 is fabricated over a landing yoke 17. Landing yoke 17 is attached over the middle of hinge 12, which is a torsion hinge. The ends of hinge 12 are attached to hinge support post 13. The hinge support posts 13 and electrode posts 15 support the hinge 12, address electrodes 14, and landing yoke 17 over a control bus 18 and address pads 19. When mirror 11 is tilted, the tip of the landing yoke 17 contacts the control bus 18. The control bus 18 and landing pads 19 have appropriate electrical contacts to a substrate of address circuitry, which is typically fabricated within the substrate using CMOS fabrication techniques.

The address circuit of each mirror element 10 includes a memory cell 10a. These memory cells 10a are random access memory (RAM) cells manufactured with CMOS techniques. As explained below, each memory cell 10a is loaded with 1 bit of data passed down a bit-line. Because of its single bit-line, memory cell 10a is referred to herein as a "single-bit-line" memory cell. Rows of memory cells 10a are enabled with word-lines, which may carry either a write enable or a read enable signal. Writing is used for loading data to memory cells 10a, whereas reading is used during testing in lieu of actual mirror operation.

Memory cell 10a is a two-latch cell, with a transfer signal (TR) being used to transfer data from the first latch to the second latch. The second latch communicates the state of the stored data to the mirror element 10 via electrode contacts while the first latch is being loaded with new data. The true and complement outputs of the second latch drive the mirror element electrodes.

A clear signal (CLR) is used for quickly setting the second latch to a desired state. For example, the desired state may be an "off" state to set the display to an all-black state. If there were no clear function, the AND gate for the CLR input would be replaced by an inverter. Further details of the structure and operation of the two-latch memory cell 10a of FIG. 1 are set out in U.S. patent Ser. No. 08/389,673, entitled "Spatial Light Modulator Having Single Bit-line Dual-latch Memory Cells", assigned to Texas Instruments Incorporated and incorporated by reference herein.

In the example of this description, there is a one-to-one correspondence between memory cells 10a and mirror elements 10. Thus, memory cell 10a is connected to a single pair of address electrodes 14, via nodes a and b, for a single mirror element 10. However, in other embodiments, groups of mirror elements 10 might share a memory cell 10a. The memory cell 10a would be connected to multiple pairs of address electrodes, but only the mirror element that is to be addressed with the stored data would be enabled. These shared memory cells are part of a "memory multiplexed" loading method described in U.S. patent Ser. No. 08/300,356, filed Sep. 2, 1994, entitled "Pixel Control Circuitry for Spatial Light Modulator", assigned to Texas Instruments Incorporated and incorporated by reference herein. As explained below in connection with FIG. 8, the present invention is also useful for multiplexed memory cell arrays.

Another type of mirror element is the torsion beam type, whose hinges are not hidden under the mirror 11 but rather extend from opposing sides of the mirror 11. Still other types of DMDs are cantilever beam types and flexure beam types. The invention could be used with a memory cell array that addresses any of these types of mirror elements. Various DMD types are described in U.S. Pat. No. 4,662,746, entitled "Spatial Light Modulator and Method"; U.S. Pat. No. 4,956,610, entitled "Spatial Light Modulator"; U.S. Pat. No. 5,061,049 entitled "Spatial Light Modulator and Method"; U.S. Pat. No. 5,083,857 entitled "Multi-level Deformable Mirror Device"; and U.S. patent Ser. No. 08/171,303, entitled "Improved Multi-Level Digital Micromirror Device" Each of these patents and patent applications is assigned to Texas Instruments Incorporated and each is incorporated herein by reference.

In operation for imaging applications, a light source illuminates the surface of an array of the mirror elements 10. A lens system may be used to shape the light to approximately the size of the array of mirror elements 10 and to direct this light toward them. The mirror support post 16 permits mirror 11 to rotate under control of hinge 12. Mirror 11 tilts in response to an electrostatic force caused by application of an appropriate voltage to an address electrode 14.

Voltages based on data in the memory cells 10a of the underlying CMOS circuit are applied to the two address electrodes 14, which are located under opposing corners of mirror 11. Electrostatic forces between the mirrors 11 and their address electrodes 14 are produced by selective application of voltages to the address electrodes 14. The electrostatic force causes each mirror 11 to tilt either about +10 degrees (on) or about −10 degrees (off), thereby modulating the light incident on the surface of the DMD. Light reflected from the "on" mirrors 11 is mirrors 11 is directed to an image plane, via display optics. Light from the "off" mirrors 11 is reflected away from the image plane. The resulting pattern forms an image. Various modulation techniques can be used to form greyscale images, and color images can be created with filtered light.

In effect, the mirror 11 and its address electrodes 14 form capacitors. When appropriate voltages are applied to mirror 11 and its address electrodes 14, a resulting electrostatic force (attracting or repelling) causes the mirror 11 to tilt toward the attracting address electrode 14 or away from the repelling address electrode 14.

Once the electrostatic force between the address electrodes 14 and the mirror 11 is removed, the energy stored in the hinge 12 provides a restoring force to return the mirror 11 to an undeflected position. Appropriate voltages may be applied to the mirror 11 or address electrodes 14 to aid in returning the mirror 11 to its undeflected position.

Further details describing the use of DMDs for display applications may be found in U.S. Pat. No. 5,079,544, entitled "Standard Independent Digitized Video System"; in U.S. patent Ser. No. 08/147,249, entitled "Digital Television System"; and in U.S. patent Ser. No. 08/146,385, entitled "DMD Display System." Each of these patents and patent applications is assigned to Texas Instruments Incorporated, and each is incorporated herein by reference.

Figure 2A:
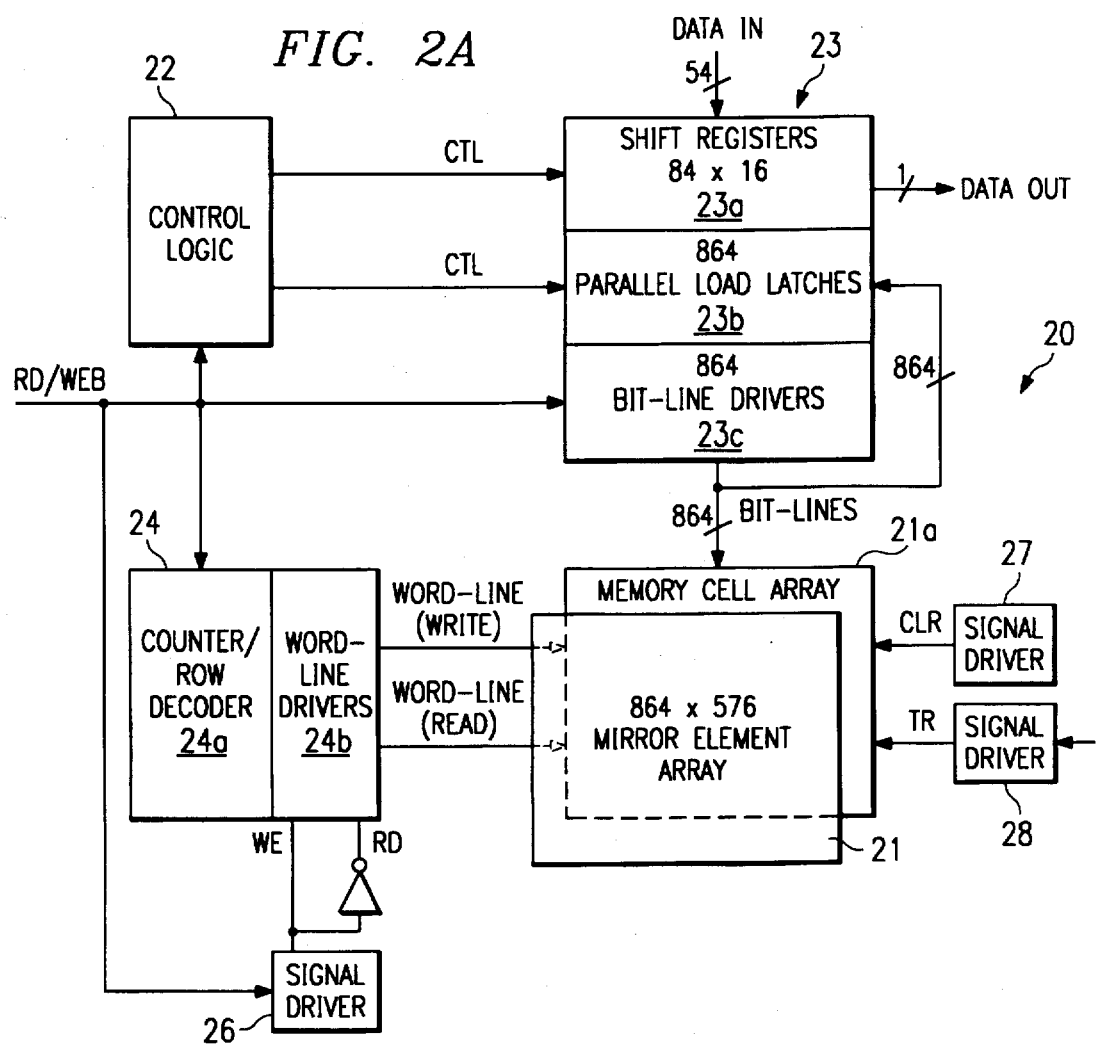
FIG. 2A illustrates the peripheral control circuitry, pixel array, and memory cell array that comprise a DMD display device, including driver circuitry in accordance with the invention.

FIG. 2A is a block diagram of a DMD device 20 having a mirror element array 21, which is fabricated over a memory cell array 21a. The mirror element array 21 has mirror elements 10, and the memory cell array 21a has memory cells 10a, such as those of FIG. 1.

DMD device 20 also has peripheral control circuitry, including a control logic circuit 22, a pixel data loading circuit 23, and a row selector 24. DMD device 20, without the operating voltage characteristics of the present invention, is further described in U.S. patent Ser. No. 08/373,692, entitled "Monolithic Programmable Format Pixel Array", assigned to Texas Instruments Incorporated and incorporated by reference herein.

As explained above, in the example of this description, there is a one-to-one correspondence between memory cells 10a and mirror elements 10, such that each memory cell 10 of array 21a is connected to the address electrodes of a single mirror element 10 of array 21. In the example of this description, mirror element array 21 has 864 mirror elements per row (864 columns) and 576 rows of mirror elements. This is a typical array size for display applications.

Each memory cell of array 21a receives the input signals described above in connection with FIG. 1. As is also illustrated in FIG. 2, these input signals include a pixel data signal on its bit-line, a read or a write signal on its word-lines, a transfer signal (TR), and a clear signal (CLR).

A characteristic of DMD device 20 is that its mirror element array 21 is operated at a higher voltage level than are one or more of the peripheral circuits 22, 23, or 24. For example, array 21 might use addressing signals of 8 volts and the peripheral control circuits might be TTL or CMOS circuitry using 5 volts. As explained below, a feature of the invention is that the input signals to memory cell array 21a are driven with drivers that provide a voltage level greater than that used for the peripheral control circuits. Thus, data loading circuit 23 has bit-line drivers 23c for driving pixel data down the bit-lines. Row selector 24 has word-line drivers 24a for driving read and write signals across word-lines. Signal drivers 26, 27, and 28 drive a read/write (R/W) control signal, the clear (CLR) signal, and the transfer (TR) signal, respectively.

Figure 2B:
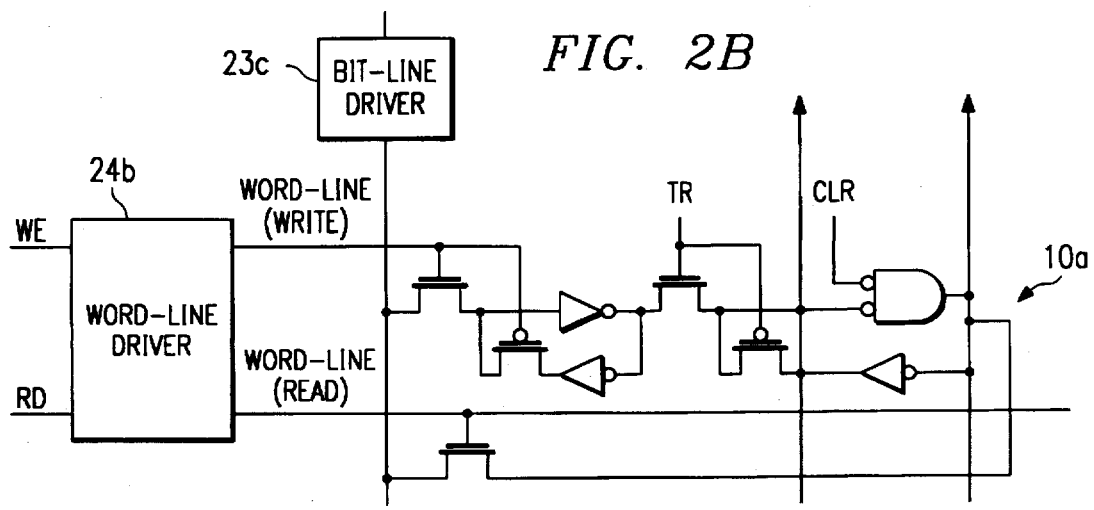
FIG. 2B illustrates a single memory cell and its associated driver circuitry.

FIG. 2B illustrates how a bit-line driver 23c and the word line drivers 24b of FIG. 2A are related to a single memory cell 10a.

Referring again to FIG. 2A, pixel data is loaded into memory cell array 21a via data loading circuit 23 in a special "bit-plane" format. Instead of being in pixel format, where data is ordered by pixel, row, frame, the data is ordered by bit, row, bit-plane, frame. In other words, the primary order of the data is bit-by-bit, with all bits of one bit weight for all pixels being ordered together, then all bits of another bit weight, etc. For example, 8-bit pixel data would be ordered into 8 bit-planes, each bit-plane being comprised of the data for 1 of 8 bit weights. This permits all mirror elements of DMD device 20 to be simultaneously addressed with an electrical signal corresponding to a 1-bit value loaded to their associated memory cells. The length of time that any one mirror element remains on is controlled in accordance with the bit weight.

The formatting of data in this manner permits a type of pulse width modulation, which permits DMD device 20 to generate greyscale images. For display applications, further details describing pulse width modulation and the formatting of the data for input to DMD device 20 are set out in U.S. Pat. No. 5,278,652, entitled "DMD Architecture and Timing for Use in a Pulse Width Modulated Display System", assigned to Texas Instruments Incorporated and incorporated by reference herein.

Although all mirror elements 10 of mirror element array 21 are simultaneously addressed, the memory cells 10a are loaded on a row-by-row basis. This is accomplished with data loading circuit 23. After all memory cells 10a of array 21a are loaded, the mirror elements 10 are addressed via their address electrodes 14. Control logic circuit 22 provides timing and control signals that synchronize the data loading circuit 23 and row selector 24 to the data being loaded.

Data loading circuit 23 is comprised of a number of shift registers 23a. During one clock period, each shift register 23a receives 1 bit of data. Thus, for n-bit shift registers 23a, the load cycle to fill shift registers 23a requires n clock periods. For example, for an 864-column array, 54 16-bit shift registers 23a each receive a 1-bit value during each clock cycle, with 16 clock cycles for loading one row of data.

After shift registers 23a receive one row of data, they pass this row data in parallel to parallel latches 23b. Parallel latches 23b hold the row data, while shift registers 23a are receiving the next row.

Parallel latches 23b provide the row data in parallel on the bit-lines via bit-line drivers 23c. More specifically, they hold the row data on the bit-lines, such that each column of memory cells 10a receives a data signal representing a bit of data.

Each of the 864 bit-lines has an associated bit-line driver 23c. As shown in FIG. 2A, the same bit-lines are used within memory cell array 21a for writing and reading. Drivers 23c drive the input data during write operation, and are disabled when data is output during read operation.

Figure 3:
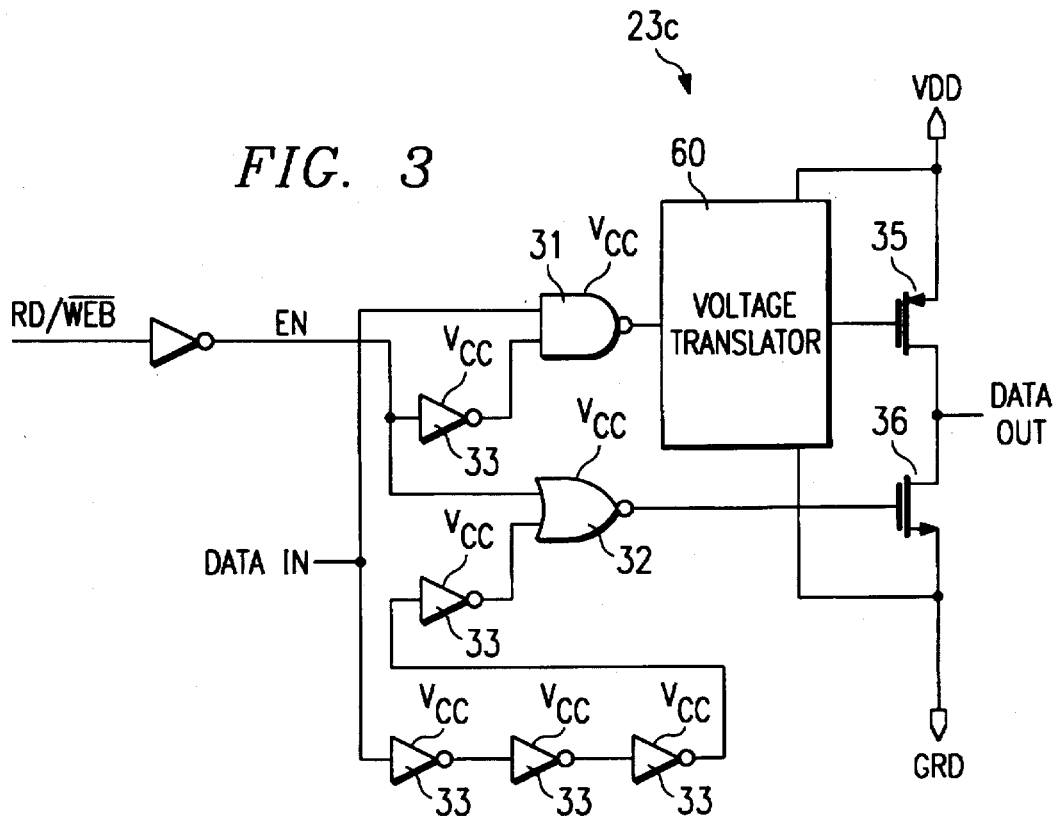
FIG. 3 illustrates one of the bit-line drivers of FIGS. 2A and 2B.

FIG. 3 illustrates one of the bit-line drivers 23c of FIGS. 2A and 2B. The input data (DATA IN) is received from parallel latches 23b. An enable signal (EN) provided to driver 23c is enabled with a logic "1" when the read/write line RD-WEB is a logic "0", corresponding to a write cycle. The output signal (DATA OUT) of the driver 23c is the output between two complementary series-connected PMOS and NMOS transistors 35 and 36, respectively. A first logic gate 31 controls the input to transistor 35 via a voltage translator 60. Voltage translator 60 is explained in detail in connection with FIG. 6, but essentially it changes the input voltage level to a desired output voltage level. A second logic gate 32 controls the input to the second transistor 36. Inverters 33 provide appropriate delays.

The logic devices of bit-line drivers 23c are operated at a low voltage, Vcc. The output has a voltage pull-up of a desired voltage level, Vdd, for operating memory cell array 21a. In the preferred embodiment, voltage translator 60 increases an input signal from 5 volts to 8 volts. The size of the output transistors 35 and 36 is matched to the load, timing, and current requirements of array 21a. Because transistor 35 is PMOS, there is no voltage drop from drain to source, and Vdd is passed to DATA OUT.

A feature of bit-line driver 23c is that it is a three-state driver. A predetermined combination of inputs will result in both output transistors 35 and 36 being off. This gives a high output impedance and permits pixel data to be read from memory cell array 21a back to shift registers 23a. In addition, the voltage of an address to one electrode can be pulsed by pulsing the Vdd supply between 8 and 3 volts to supplement a "reset" operation, without losing the contents of the memory cells.

Referring again to FIG. 2A, the row of memory cells of array 21a that is to receive a row of data is selected with a row selector 24. A row decoder 24a provides a row address signal, which may be generated with a counter for loading consecutive rows. Row decoder 24a delivers the address signal to word-line drivers 24b. In the example of this description, which is not a memory multiplexed configuration, there is one word-line driver for each row of array 21a.

Figure 4:
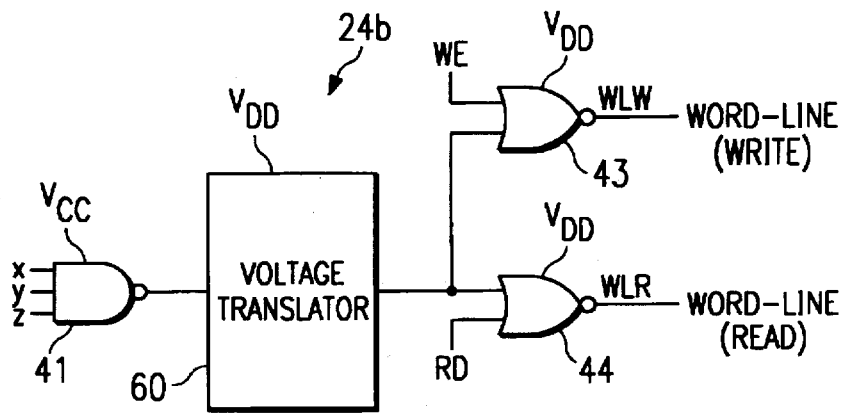
FIG. 4 illustrates one of the word-line drivers of FIGS. 2A and 2B.

FIG. 4 illustrates one of the word-line drivers 24b of FIGS. 2A and 2B. An input gate 41 receives row address input, xyz, from row decoder 24a, which it delivers to voltage translator 60. As explained below in connection with FIG. 6, voltage translator 60 increases the voltage level of this address signal. The address signal is combined with a write control signal (WE) at a first logic gate 43, and with a read control signal (RD) at a second logic gate 44, to determine whether data will be written to the memory cells of array 21a or read from them. Referring to FIGS. 4 and 1, for writing data, the word-line write signal (WLW) is high and the word-line read signal (WLR) is low, such that data is written into the first latch of each memory cell. For reading data, WLW is low and WLR is high and data is transferred to the bit-lines from the second latch.

Referring again to FIGS. 2A and 2B, the read and write control signals (RD and WE) delivered to word-line drivers 24b are delivered via a signal driver 26. Signal driver 26 provides them with an increased "high" voltage level. Signal driver 26 is similar in structure and operation to signal drivers 27 and 28, which deliver the CLR and TR signals, respectively, to the memory cells of array 21.

Figure 5:
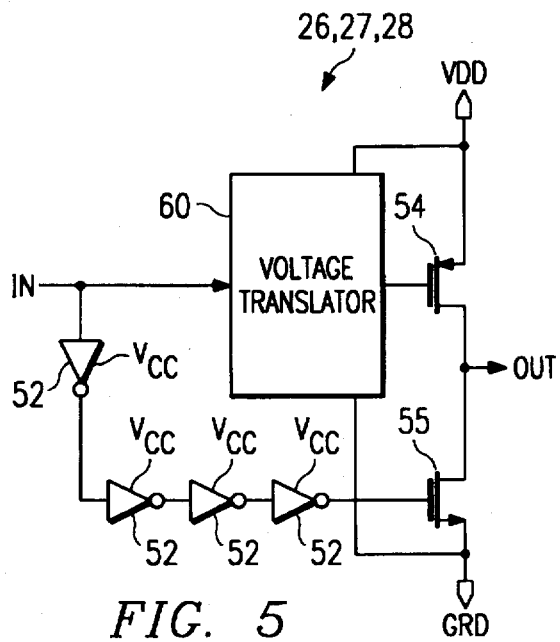
FIG. 5 illustrates one of the signal drivers of FIG. 2A.

FIG. 5 illustrates drivers 26, 27, and 28. The input signal (IN) is the RD/WEB, CLR, or TR signal for drivers 26, 27, or 28, respectively. This input signal is directed to both a voltage translator 60 and a series of inverters 52. The structure and operation of voltage translator 60 is described below in connection with FIG. 6, but essentially it increases the voltage level of the input signal. The output signal (OUT) of the signal driver 26, 27, or 28 is between a PMOS transistor 54 and an NMOS transistor 55, which are complementary and series-connected. The voltage pull-up is at the desired output voltage level, Vdd. The PMOS transistor 54 has essentially no voltage drop from drain to source when enabled, and the output is essentially Vdd. The control logic, Vcc, is lower than Vdd.

Figure 6:
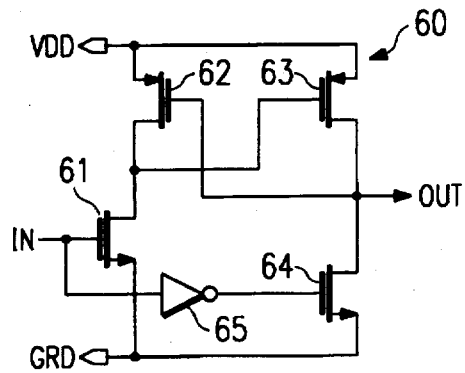
FIG. 6 illustrates the voltage translator used in the drivers of FIGS. 3–5.

FIG. 6 illustrates the voltage translator 60 of bit-line driver 23c, word-line driver 24b, and signal drivers 26, 27, and 28. The supply voltage, Vdd, is at a desired level for addressing the memory cells of array 21a via their address electrodes 14. A typical range of Vdd is 3 to 8 volts. Voltage translator 60 is comprised of 4 transistors 61–64 and an inverter 65. Voltage translator 60 is essentially a level shifter, and other level shifter configurations could be used.

Figure 7:
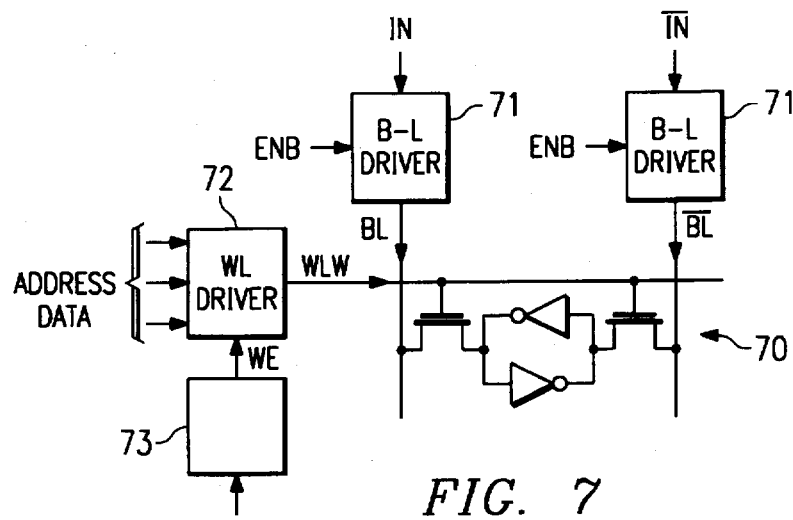
FIG. 7 illustrates an alternative type of memory cell and associated driver circuits.

FIG. 7 illustrates a single memory cell 70 and associated drivers 71, 72, and 73, for an alternative embodiment of the invention. Memory cell 70 is a six-transistor static memory cell, having two bit-lines that receive data and complement data. For this reason, memory cell 70 is referred to herein as a "two-bit-line" memory cell to distinguish it from memory cell 10a of FIG. 1.

Memory cell 70 could be used in place of the single-bit-line memory cell 10a of FIG. 1. In this case, memory cell array 21a of FIG. 2A would be an array of memory cells 70. Each column of array 21 would have two bit-lines, one for the data value and one for its complement. For an array of memory cells 70, the peripheral circuitry would be the same as in FIG. 2A, except data loading circuit 23 would also have inverters for providing the complement data signal on the second bit-line. Each bit-line, both true and complement, would have its own bit-line driver 71, with a structure and operation similar to that of bit-line driver 23c. Each word-line also has a word-line driver 72, which receives a write control signal (WE) and address input. Word-line driver 72 has a structure and operation similar to that of word-line drivers 24b except without the extra logic for reading data. The WE signal undergoes a voltage level change by signal driver 73, which is the same as signal driver 26.

Figure 8:
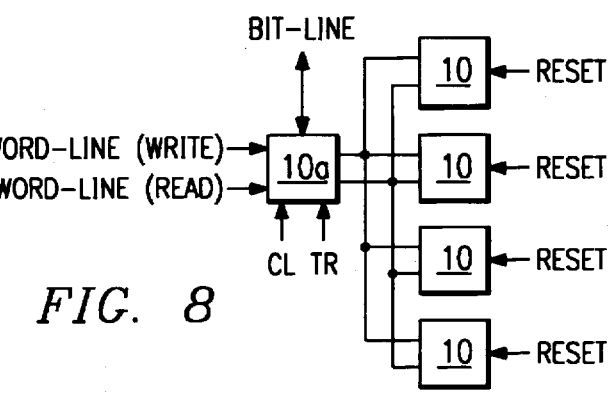
FIG. 8 illustrates one memory cell and its associated mirror elements, as configured for "memory multiplexed" operation of the device of FIG. 2A.

FIG. 8 illustrates an example of a memory multiplexed configuration that can be incorporated into the DMD device 20 of FIG. 2A. One memory cell 10a and its associated mirror elements 10 are illustrated. In the example of this description, the "fanout" of each memory cell 10a is four mirror elements 10, but other fanouts could be easily implemented. Every four consecutive mirror elements 10 of each column of array 21 share a memory cell 10a. Thus, each memory cell 10a is in electrical communication, via address electrodes, with four mirror elements 10. Memory cell 10a receives bit-line, word-line, clear, and transfer input signals, via drivers like those of FIG. 2A. However, instead of a row of memory cells 10a and a word-line driver 24b for every row of mirror element array 21, there is a row of memory cells 10a and a word-line driver 24b for every four rows of array 21. In other words, each row of memory cells 10a is associated with 4 rows of pixels.

For memory multiplexed operation, in each group of four mirror elements 10, the mirror element 10 that is to be actually addressed with the data in memory cell 10a is selected with a control signal. Thus, memory cell 10a is loaded four times as frequently as compared to non-multiplexed operation. In a memory multiplexed configuration, although loading cycles must occur more frequently, there are fewer memory cells and less data is required to be loaded at once.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A spatial light modulator, comprising:

(a) an array of electrically addressable pixels;

(b) an array of memory cells arranged in rows and columns, each said memory cell being in electrical communication with at least one of said pixels; and (c) control circuitry controlling said array of memory cells, including:
      (i) a bit-line associated with each said column of said memory cells, each said bit-line for delivery pixel data to at least one said memory cell;
      (ii) a write word-line associated with each said row of said memory cells, each said write word-line delivering a write signal enabling said row of said memory cells to be written with said pixel data; and (d) a bit-line driver circuit increasing a voltage level of said pixel data before said pixel data is delivered to said memory cells, said bit-line driver circuit operating on a first power supply and said control circuitry operating on a second power supply independent from said first power supply.

2. The spatial light modulator of claim 1, wherein there is a one-to-one correspondence between said memory cells and said pixels.

3. The spatial light modulator of claim 1, wherein said write word-line driver circuit has logic circuitry combining an enable signal with said pixel data and has a voltage translator in series connection with said logic circuitry.

4. The spatial light modulator of claim 1, wherein each said memory cell has a first latch feeding a second latch, said first latch transferring said pixel data to said second latch as a function of a transfer signal provided on a transfer line, said transfer line having a transfer signal driver circuit increasing a voltage of said transfer signal.

5. The spatial light modulator of claim 1, further comprising a read word-line associated with each said row of said memory cells, each said read word-line delivering a read signal enabling said pixel data to be read from said memory cell.

6. The spatial light modulator of claim 1, wherein each said pixel comprises a deflectable mirror fabricated over a pair of address electrodes, said address electrodes being connected to said associated memory cell.

7. The spatial light modulator of claim 1, further comprising a write word-line driver circuit increasing a voltage level of said write signal before delivered to said memory cells.

8. The spatial light modulator of claim 7, wherein each write word-line is associated with a single row of said pixels.

9. The spatial light modulator of claim 7, wherein said write word-line driver circuit has logic circuitry for combining said write signal with an address signal and a voltage translator in series connection with said logic circuitry.

10. A spatial light modulator, comprising:

(a) an array of electrically, addressable pixels;

(b) an array of memory cells arranged in rows and columns, each said memory cell being in electrical communication with at least one of said pixels; and (c) control circuitry controlling said array of memory cells, including:
       (i) a bit-line associated with each said column of said memory cells, each said bit-line for delivery pixel data to at least one said memory cell;
       (ii) a write word-line associated with each said row of said memory cells, each said write word-line delivering a write signal enabling said row of said memory cells to be written with said pixel data; and (d) a bit-line driver circuit increasing a voltage level of said pixel data before said pixel data is delivered to said memory cells, wherein a single said memory cell stores said pixel data for multiple said pixels.

11. A spatial light modulator, comprising:

(a) an array of electrically addressable pixels;

(b) an array of memory cells arranged in rows and columns, each said memory cell being in electrical communication with at least one of said pixels; and (c) control circuitry controlling said array of memory cells, including:
       (i) a bit-line associated with each said column of said memory cells, each said bit-line for delivery pixel data to at least one said memory cell;
       (ii) a write word-line associated with each said row of said memory cells, each said write word-line delivering a write signal enabling said row of said memory cells to be written with said pixel data; and (d) a bit-line driver circuit increasing a voltage level of said pixel data before said pixel data is delivered to said memory cells, wherein each word-line is associated with multiple said rows of said pixels.

12. A digital micromirror device, comprising:

a mirror element array, each said mirror element being addressable via at least one address electrode and tilting in response to an address signal applied at said address electrode;

a memory cell array arranged in columns and rows storing data representing a state of said address signal, each said memory cell being in electrical communication with at least one of said mirror elements via at least one said address electrode, each said memory cell having a first latch that transfers said data to a second latch in response to a transfer signal, said second latch providing said electrical communication of said address signal, to said address electrode;

a bit-line associated with each said column of said memory cell array, each said bit-line delivering said data down one said column of said memory cells to at least one said memory cell, each said bit-line having a bit-line driver circuit changing a voltage level of said data before said data is delivered to said memory cell;

a write word-line associated with each said row of said memory cells, each said write word-line delivering a write signal enabling one said row of said memory cells to be written with said data, each said write word-line having a word-line driver circuit changing a voltage level of said write signal; and a transfer signal driver circuit changing a voltage level of said transfer signal.

13. The device of claim 12, further comprising a data loading circuit receiving said data on a row-by-row basis, and delivering said row data to said memory cells via said bit-lines.

14. The device of claim 13, further comprising a row selector determining which said row of said memory cells receives said row of data.

15. The device of claim 12, wherein each said pixel has a true said address electrode and a complement said address electrode, and wherein said second latch has a true output and a complement output connected to one said address electrode.

* * * * *